United States Patent
Coughlin, Jr. et al.

(10) Patent No.: US 6,922,074 B2
(45) Date of Patent: Jul. 26, 2005

(54) ASIC ARCHITECTURE FOR ACTIVE-COMPENSATION OF A PROGRAMMABLE IMPEDANCE I/O

(75) Inventors: Terry C. Coughlin, Jr., Endicott, NY (US); Geoffrey Wang, Endicott, NY (US)

(73) Assignee: International Business Machines Corporation, Armonk, NY (US)

(*) Notice: Subject to any disclaimer, the term of this patent is extended or adjusted under 35 U.S.C. 154(b) by 35 days.

(21) Appl. No.: 10/072,165

(22) Filed: Feb. 7, 2002

(65) Prior Publication Data

US 2003/0146774 A1 Aug. 7, 2003

(51) Int. Cl.[7] .................. H03K 17/16; H03K 19/003
(52) U.S. Cl. ..................... 326/30; 326/86; 327/109
(58) Field of Search .......................... 326/30, 32, 86, 326/83; 327/109

(56) References Cited

U.S. PATENT DOCUMENTS

| | | |
|---|---|---|
| 5,479,123 A | 12/1995 | Gist et al. |
| 5,581,197 A | 12/1996 | Motley et al. |
| 5,602,494 A | 2/1997 | Sundstrom |
| 5,666,078 A | 9/1997 | Lamphier et al. |
| 5,687,330 A | 11/1997 | Gist et al. |
| 5,705,937 A | 1/1998 | Yap |
| 5,726,583 A | 3/1998 | Kaplinsky |
| 5,919,252 A | 7/1999 | Klein |
| 5,955,894 A | * 9/1999 | Vishwanthaiah et al. ..... 326/86 |
| 6,133,749 A | 10/2000 | Hansen et al. |
| 6,307,791 B1 | * 10/2001 | Otsuka et al. ......... 365/189.05 |

* cited by examiner

*Primary Examiner*—Daniel Chang
(74) *Attorney, Agent, or Firm*—Scully, Scott, Murphy & Presser; William H. Steinberg, Esq.

(57) ABSTRACT

A method of, and a circuit for, impedance control. The method comprises the steps of providing an input/output cell having a controllable input/output impedance, providing a reference cell including a node having a variable voltage, and comparing the voltage of the node to a reference voltage. The voltage of the node is adjusted during a defined period and according to a defined procedure, and during that defined period, a digital signal is generated. That digital signal is transmitted to the input/output cell to adjust the input/output impedance. Preferably, the circuit is embodied as a digital controller designed as a synthesized core or macro. The advantage of this implementation is that it never has to be redesigned in future technologies. The digital controller may be carried over to future technologies in the form of VHDL code, which is pure logic and independent of technology.

20 Claims, 10 Drawing Sheets

DRIVER-IMPEDANCE UPDATE LOGIC

ASIC ARCHITECTURE

| 2-A |
|---|
| 2-B |

| | |
|---|---|
| A | DRIVER DATA INPUT |
| TS | DRIVER TRI-STATE CONTROL |
| DI | DRIVER INHIBIT INPUT (DI IN) |
| LT | DC CURRENT GATE ($I_{dd}$ TEST) INPUT |
| RI | RECEIVER INHIBIT INPUT (RI IN) |
| RG | RECEIVER GATE CONTROL |
| VREF | VOLTAGE REFERENCE INPUT |
| PAD | DRIVER OUTPUT/RECEIVER INPUT |
| ZDI | DRIVER INHIBIT OUTPUT (DI OUT) |
| ZRI | RECEIVER INHIBIT OUTPUT (RI OUT) |
| Z | RECEIVER OUTPUT |
| PVTN0 | NFET PVT CONTROL BIT (LSB) |
| PVTN1 | NFET PVT CONTROL BIT |
| PVTN2 | NFET PVT CONTROL BIT |
| PVTN3 | NFET PVT CONTROL BIT |
| PVTN4 | NFET PVT CONTROL BIT |
| PVTN5 | NFET PVT CONTROL BIT (MSB) |
| PVTP0 | PFET PVT CONTROL BIT (LSB) |
| PVTP1 | PFET PVT CONTROL BIT |
| PVTP2 | PFET PVT CONTROL BIT |
| PVTP3 | PFET PVT CONTROL BIT |
| PVTP4 | PFET PVT CONTROL BIT |
| PVTP5 | PFET PVT CONTROL BIT (MSB) |
| PNDRIVE | DEFAULT CONTROL BIT |
| NOUPDT | PREVENTS BIT UPDATE |
| TESTUPDT | UPDATES BITS |

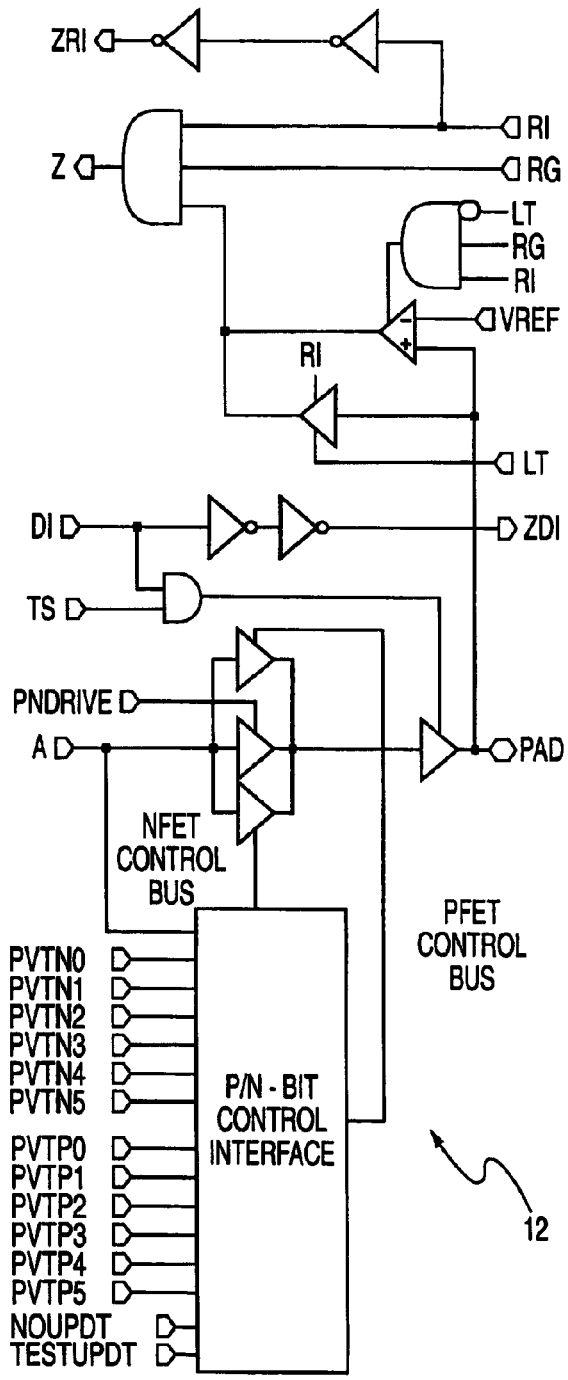

CONTROLLED I/O CELL

FIG. 3

DRIVER-IMPEDANCE UPDATE LOGIC

| INPUTS | | | OUTPUTS | | |
|---|---|---|---|---|---|
| A | NOUPDT | TESTUPDT | P-BITS | N-BITS | COMMENTS |
| X | 1 | 0 | NC[1] | NC[1] | INPUT BITS CHANGING |
| 0 | 0 | 0 | UPDATE[2] | HOLD[2] | UPDATE P-BITS ONLY |
| 1 | 0 | 0 | HOLD[3] | UPDATE[3] | UPDATE N-BITS ONLY |
| X | X | 1 | UPDATE[4] | UPDATE[4] | FORCE UPDATE TO ALL P/N-BITS |

1. WHEN "NOUPDT" IS HIGH, THE INPUT CONTROL BITS WILL BE UPDATED AND THE I/O WILL HOLD THE PRESENT STATE OF THE CONTROL BITS UNTIL "NOUPDT" GOES LOW. THIS PREVENTS THE I/O FROM CHANGING THE OUTPUT IMPEDANCE WHILE THE INPUT CONTROL BITS ARE UNSTABLE.

2. WHEN THE DATA INPUT "A" CHANGES FROM A HIGH TO A LOW STATE, THE PULL-UP IMPEDANCE WILL BE UPDATED. THE P-BITS WILL BE LATCHED WHEN "A" TOGGLES FROM LOW TO HIGH.

3. WHEN THE DATA INPUT "A" CHANGES FROM A LOW TO A HIGH STATE, THE PULL-DOWN IMPEDANCE WILL BE UPDATED. THE N-BITS WILL BE LATCHED WHEN "A" TOGGLES FROM HIGH TO LOW.

4. WHEN "TESTUPDT" IS HIGH, ALL THE DATA LATCHES WILL BECOME TRANSPARENT AND BOTH THE PULL-UP AND PULL-DOWN IMPEDANCE WILL BE UPDATED.

NOTE: "TESTUPDT" IS USEFUL TO THE USER TO UPDATE THE OUTPUT IMPEDANCE IF THE I/O HAS BEEN SITTING IN Hi-Z OR THE "A" INPUT HAS NOT TOGGLED FOR A LONG PERIOD OF TIME.

DRIVER IMPEDANCE UPDATE TABLE

FIG. 5

| INPUTS | | | | | OUTPUTS | |
|---|---|---|---|---|---|---|
| A | TS | DI | PNDRIVE | PVTN[0:5] PVTP[0:5] | PAD | ZDI |
| - | 0 | - | - | - | Hi-Z[1] | DI |
| - | - | 0 | - | - | Hi-Z[1] | D1 |
| - | 1 | 1 | 0 | 0 | Hi-Z[2] | D1 |
| - | 1 | 1 | - | 1[3] | A | D1 |
| - | 1 | 1 | 1 | - | A | D1 |

1. PAD IS Hi-Z IF DRIVER IS NOT EXTERNALLY TERMINATED. PAD IS AT "$V_{ddq}/2$" IF DRIVER IS TERMINATED (OFF-CHIP).
2. PNDRIVE=0 IS FOR TEST ONLY. THIS FORCES THE DEFAULT BIT OFF SUCH THAT THE LSB'S CAN BE TESTED.
3. AT LEAST ONE PVTN BIT AND ONE PVTP BIT MUST BE AT A LOGIC "1".

NOTES: A. LOGICAL "1" = $V_{ddq}$ = $V_{DD150}$ = 1.5V. (NOMINAL)
B. NEW DELAY RULE (NDR) WILL BE BASED ON DRIVER TERMINATED OFF-CHIP.

DRIVER TRUTH TABLE

FIG. 6

| INPUTS | | | | | OUTPUTS | | |
|---|---|---|---|---|---|---|---|
| PAD | LT | RI | RG | VREF | Z | ZRI | COMMENTS |
| - | - | - | 0 | - | 0 | RI | TEST MODE |
| - | - | 0 | - | - | 0 | RI | TEST MODE |
| 1[1] | 0 | 1 | 1 | - | 1 | RI | FUNCTIONAL MODE |
| 0[2] | 0 | 1 | 1 | - | 0 | RI | FUNCTIONAL MODE |
| 1[3] | 1 | 1 | 1 | - | 1 | RI | BYPASS MODE |
| 0[4] | 1 | 1 | 1 | - | 0 | RI | BYPASS MODE |

1. PAD INPUT REQUIRES HSTL LEVEL "HIGH" AND $V_{ddq} < V_{dd}$.
2. PAD INPUT REQUIRES HSTL LEVEL "LOW."
3. PAD INPUT REQUIRES CMOS LEVEL "HIGH" AND $V_{ddq} = V_{dd}$.
4. PAD INPUT REQUIRES CMOS LEVEL "LOW."

RECEIVER TRUTH TABLE

FIG. 7

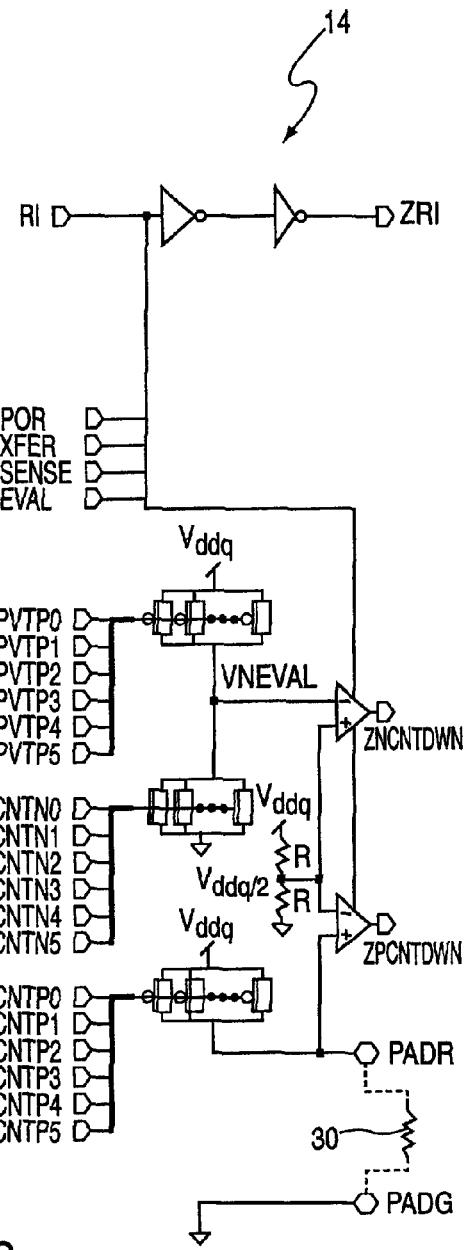

| | |
|---|---|
| RI | RECEIVER INHIBIT INPUT (RI IN) |
| PADR | EXTERNAL RESISTOR NODE 1 OF 2 |
| PADG | EXTERNAL RESISTOR NODE 2 OF 2 |
| ZRI | RECEIVER INHIBIT OUTPUT (RI OUT) |
| POR | POWER ON RESET |
| XFER | TRANSFER DATA TO LATCH |
| SENSE | NULL SENSE-AMPLIFIER |
| EVAL | EVALUATE IMPEDANCE |
| CNTN0 | NFET PVT COUNT BIT 0 (LSB) |
| CNTN1 | NFET PVT COUNT BIT 1 |
| CNTN2 | NFET PVT COUNT BIT 2 |
| CNTN3 | NFET PVT COUNT BIT 3 |
| CNTN4 | NFET PVT COUNT BIT 4 |
| CNTN5 | NFET PVT COUNT BIT 5 (MSB) |
| CNTP0 | PFET PVT COUNT BIT 0 (LSB) |
| CNTP1 | PFET PVT COUNT BIT 1 |
| CNTP2 | PFET PVT COUNT BIT 2 |
| CNTP3 | PFET PVT COUNT BIT 3 |
| CNTP4 | PFET PVT COUNT BIT 4 |
| CNTP5 | PFET PVT COUNT BIT 5 (MSB) |
| PVTP0 | PFET PVT CONTROL BIT 0 (LSB) |
| PVTP1 | PFET PVT CONTROL BIT 1 |
| PVTP2 | PFET PVT CONTROL BIT 2 |
| PVTP3 | PFET PVT CONTROL BIT 3 |
| PVTP4 | PFET PVT CONTROL BIT 4 |
| PVTP5 | PFET PVT CONTROL BIT 5 (MSB) |
| ZPCNTDWN | COUNT DOWN PFET FINGERS |
| ZNCNTDWN | COUNT DOWN NFET FINGERS |

FIG. 8

| INPUTS | | | | | | OUTPUTS | |
|---|---|---|---|---|---|---|---|
| RI | POR | EVAL | SENSE | XFER | CNTN0-CNTN5 CNTP0-CNTP5 PVTP0-PVTP5 | ZPCNT DWN | ZNCNT DWN |
| 0 | X | X | X | X | X | 0 | 0 |
| X | 0 | X | X | X | X | 0 | 0 |
| 1 | 1 | 1 | 1 | 1 | X | X[1] | X[1] |
| 1 | 1 | 1 | 0 | 1 | X | 1[2] | 1[3] |
| 1 | 1 | 1 | 0 | 1 | X | 0[4] | 0[5] |
| 1 | 1 | 1 | 0 | 0 | X | LATCH[6] | LATCH[6] |
| 1 | 1 | 0 | 0 | 0 | X | HOLD[7] | HOLD[7] |

1. EVAL = 1, POWER UP THE CELL; SENSE = 1, NULLS COMPARATOR INPUTS.
2. ZPCNTDWN = 1, WHEN VPADR > $V_{ddq}/2$
3. ZNCNTDWN = 1, WHEN VNEVAL < $V_{ddq}/2$
4. ZPCNTDWN = 0, WHEN VPADR < $V_{ddq}/2$
5. ZNCNTDWN = 0, WHEN VNEVAL > $V_{ddq}/2$
6. XFER = 0, LATCHES THE COMPARATOR OUTPUTS.
7. THE REFERENCE I/O IS POWERED DOWN AND THE PRESENT STATES OF THE OUTPUTS ARE HELD.

REF TRUTH TABLE

FIG. 9

ASIC ARCHITECTURE FOR ACTIVE-COMPENSATION OF A PROGRAMMABLE IMPEDANCE I/O

BACKGROUND OF THE INVENTION

1. Field of the Invention

This invention generally relates to I/O cells with programmable active input bias. More specifically, the invention relates to a circuit architecture, and to a method of using this circuit architecture, for an actively compensated and programmable impedance I/O.

2. Prior Art

CMOS I/O drivers require a tightly controlled driver impedance to maintain signal integrity when switched at high speeds. I/O drivers have been designed that maintain the driver's impedance by making adjustments for Integrated Circuit (IC) process variations, temperature and voltage changes. These I/O designs consist of a custom I/O circuit design and the overhead circuitry required to set the driver impedance for a given IC process; and then maintain this impedance when changes in temperature and voltage are sensed.

The design of such dynamically-controlled and programmable impedance drivers is often quite complex compared to I/O cell designs without this type of control. Custom circuit design, test, verification and characterization of the I/O can be quite time consuming and costly. For each additional technology offering, where these same controlled impedance I/O's are required, the lengthy design process must begin again.

SUMMARY OF THE INVENTION

An object of this invention is to improve circuits and methods for controlling the impedance of I/O drivers.

Another object of the present invention is to provide a circuit architecture for an actively compensated and programmable impedance I/O.

A further object of the invention is to provide a circuit architecture, for controlling the impedance of I/O drivers, that can be translated to many technology offerings without redesigning the control circuitry.

Another object of this invention is to make the design time of a standard I/O equivalent to a dynamically controlled and programmable impedance I/O that was once only possible with a full custom circuit design.

These and other objectives are attained with a method of, and a circuit for, impedance control. The method comprises the steps of providing an input/output cell having a controllable input/output impedance, providing a reference cell including a node having a variable voltage, and comparing the voltage of the node to a reference voltage. The voltage of the node is adjusted during a defined period and according to a defined procedure, and during that defined period, a digital signal is generated. That digital signal is transmitted to the input/output cell to adjust the input/output impedance.

The preferred embodiment of the invention uses a circuit architecture for a circuit that provides an actively compensated and programmable impedance I/O that meets Application Specific Integrated Circuit (ASIC) methodology requirements and provides all the advantages of a custom circuit design. This architecture allows the design to be translated to any technology offering without redesigning the control circuitry. The main advantage the architecture provides is to make the design time of a standard I/O equivalent to a dynamically controlled and programmable impedance I/O that was once only possible with a full custom circuit design.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 3 shows the I/O cell of the architecture of FIG. 1.

FIGS. 5 and 6 show the driver impedance update logic and truth table.

FIG. 7 shows a receiver truth table.

FIG. 8 illustrates the reference cell of the architecture of FIG. 1.

FIG. 9 is a reference cell truth table.

DETAILED DESCRIPTION OF THE PREFERRED EMBODIMENTS

Figure 1:
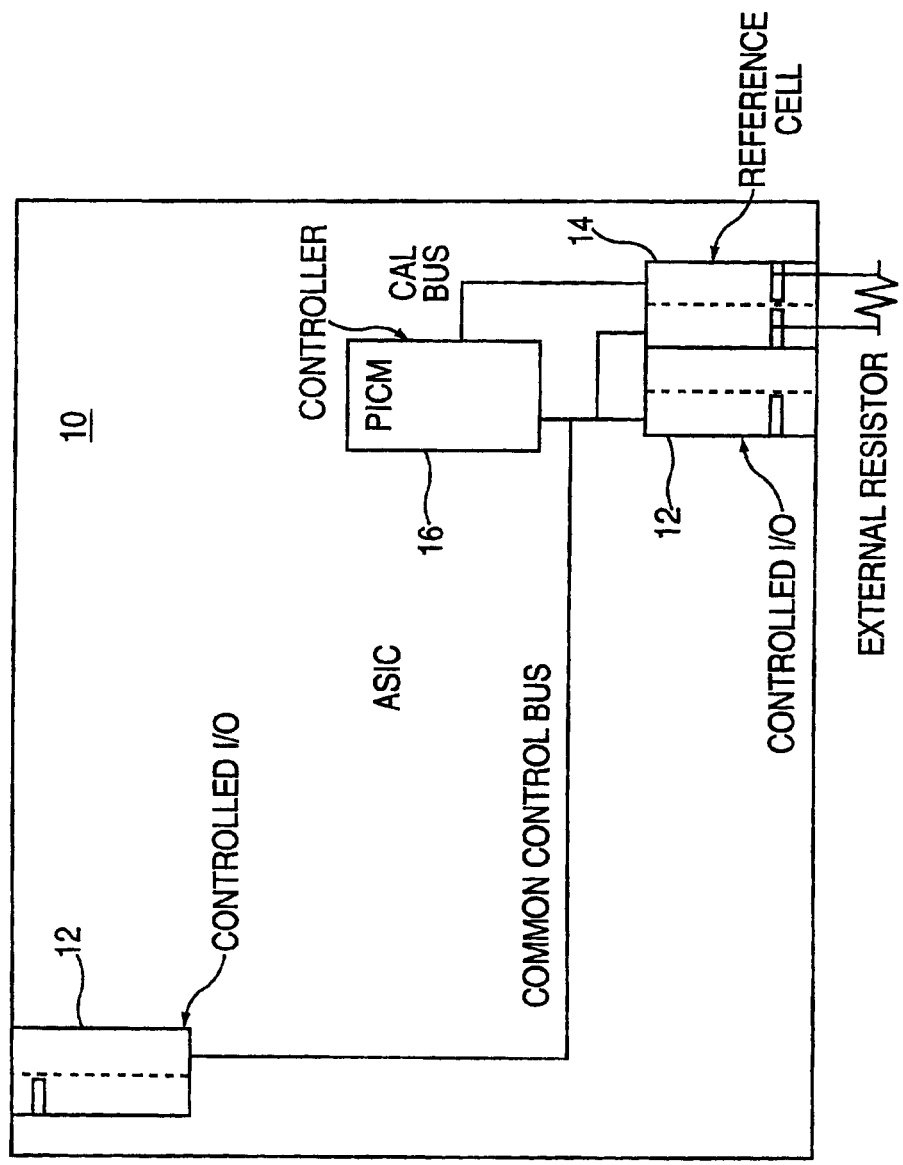
FIG. 1 shows a circuit architecture incorporating the invention.
Figures 2, 2A:
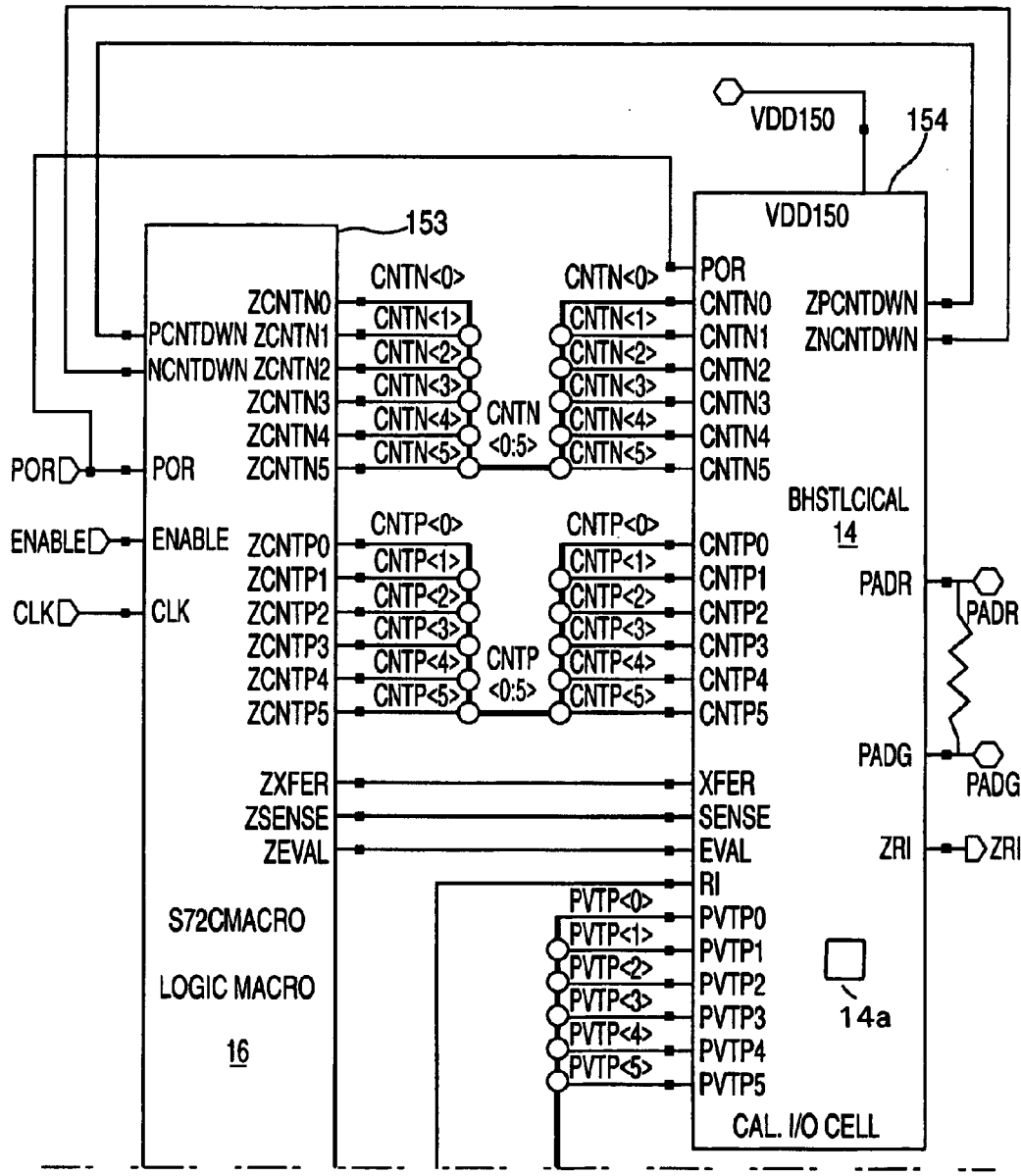
FIGS. 2, 2A and 2B are a block diagram of the system of FIG. 1, showing all the input and output signal names.

FIG. 1 shows a circuit architecture 10 generally comprising I/O cell 12 that is being controlled, reference cell 14, and digital controller 16. FIG. 2 is a more detailed block diagram of architecture 10 showing all the input and output signal names.

Figure 2B:
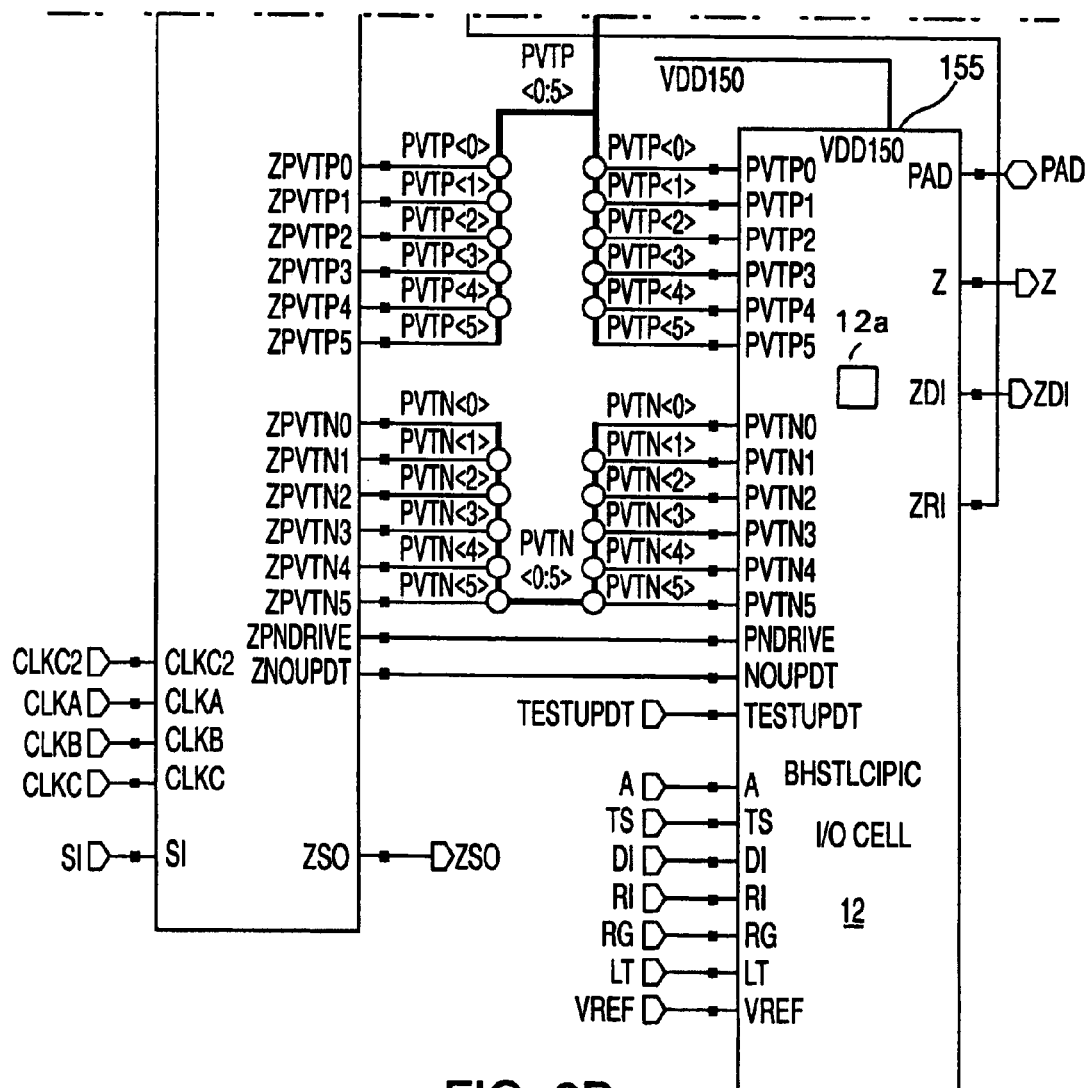

The I/O cell 12, shown in detail in FIG. 3, may be a typical high speed I/O with the addition of N number of control bits for pull-up and pull-down control of the driver Impedance. The I/O cell also has three additional control inputs PNDRIVE, NOUPDT and TESTUDT all of which come from the digital controller. A typical driver would pass data from an internal pin "A" and drive the data at the output pin "PAD" with a fixed driver impedance for both pull-up and pull-down. In the disclosed I/O cell, the driver impedance depends on the PFET, schematically represented at 12a in FIG. 2B, control bits (PVTP[5:0]) and NFET control bits (PVTN[5:0]). The input "PNDRIVE" enables a default maximum value of driver impedance to be maintained. When all the control bit inputs are disabled, the output impedance will be at its maximum impedance level when PNDRIVE is enabled. When the controller enables additional input bits PVTP[5:0] and PVTN[5:0], the driver will switch on additional PFET and NFET fingers which will lower the output impedance and increase the drivers current strength. The control bits are binary weighted with bit "0" being the LSB and bit "5" being the MSB. This yields 32 bits of resolution for both the pull-up and pull-down impedance.

The input "NOUPDT" is a strobe input from the digital controller. When NOUPDT (no-update) is asserted, the I/O will not accept the control bit inputs PVTN[5:0] and PVTP [5:0]. The signal NOUPDT is asserted before the controller sends out new values of control bits and stays asserted until all the control bits are stable. This prevents glitching of the I/O impedance when the control bit values are changing. The input "TESTUPDT" is used during testing of the I/O. This input forces the I/O to propagate the values of the input control bits to the output driver during test.

Figure 4:
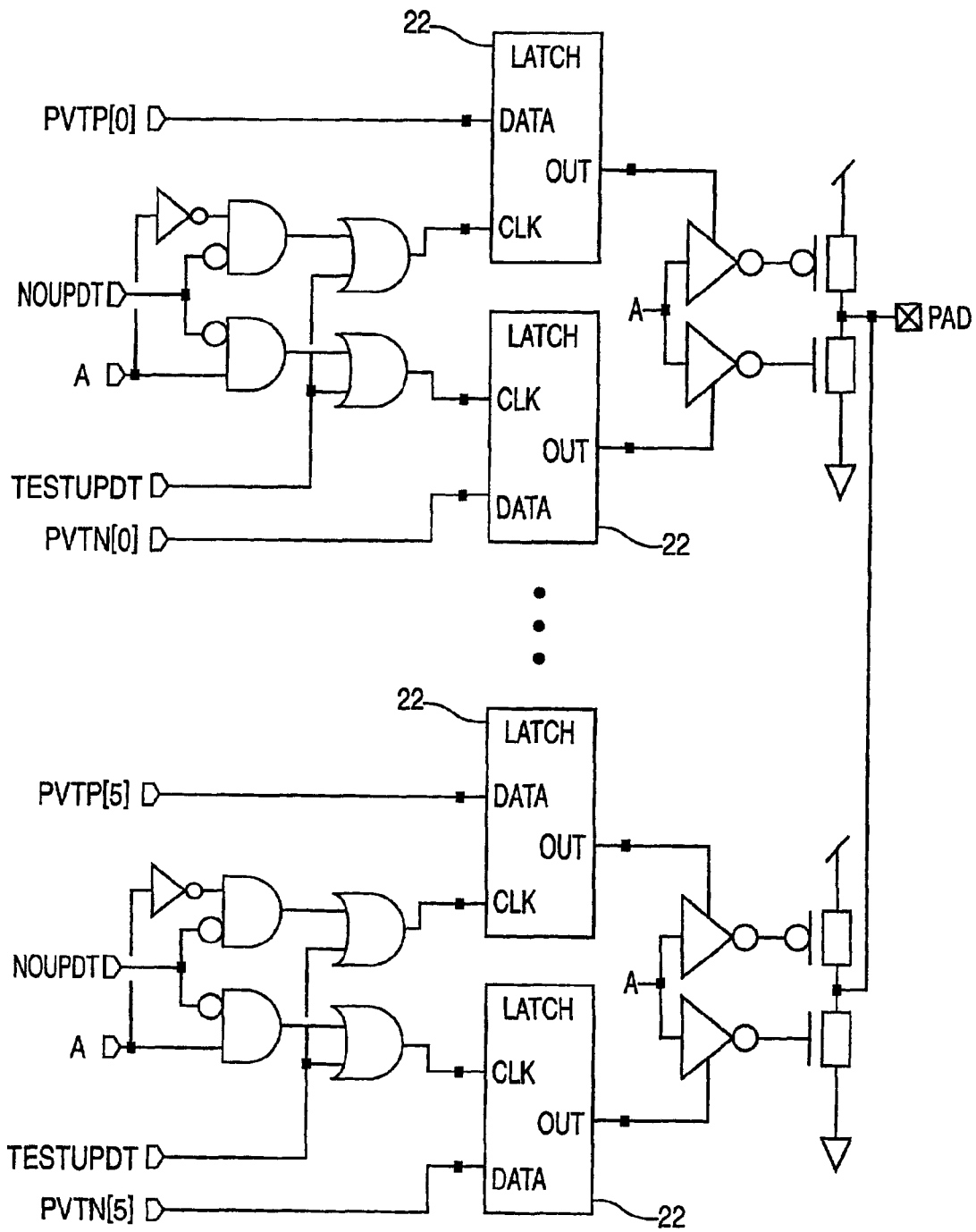
FIG. 4 illustrates the driver impedance update logic for the I/O cell.

FIG. 4 Illustrates how the P/N—Bit Control Interface 20 operates in the controlled I/O cell. FIG. 4 shows the logic for two PFET bits PVTP0 and PVTP5. The same logic is used for all bits PVTP[0:5] and PVTN[0:5]. Under normal operation, the input control bits are held in internal latches 22 and the PFET control bits are passed to the driver pull-up during a "one" to "zero" transition. Likewise, the NFET control bits are passed to the driver pull-down during a "zero" to "one" transition. This allows the digital controller to operate at any speed (usually much slower), either synchronously or asynchronously from the high speed driver. The driver impedance update logic and truth table are shown in FIGS. 5 and 6.

The receiver is unaffected by the disclosed driver and operates as any prior art receiver circuit. The receiver truth table is shown in FIG. 7.

The reference cell 14 is used to calibrate the driver impedance for all the controlled drivers on the chip. A block diagram of the reference cell is shown in FIG. 8 and the truth table for this cell is shown in FIG. 9. The driver impedance is set to match the impedance value of an external resistor 30 placed between nodes PADR and PADG. The reference cell is a physical copy of the driver output structure without the receiver and with some additional circuitry. The driver NFETs and PFETS in the I/O Cell are physically laid out as four parallel fingers that make up the total driver impedance. The calibration cell uses ¼ of the driver NFETs and PFETs for calibration. By using ¼ of the output stage, the external resistor becomes four times as large. When calibrating the driver impedance to 50 Ohms an external resistor of 200 Ohms is used.

There are two distinct advantages of using a calibration resistor that is four times larger. First, any pad transfer resistance difference between I/Os and any difference in line resistance between PADR and PADG reduces by a factor of four. As an example, an additional 2 ohms of pad transfer resistance in a 50 ohm driver would be 2/50 or 4% error in driver impedance. This same 2 ohms compared to a 200 ohms calibration resistor is now 2/200 or 1%. The second advantage is the reduction in DC power of the calibration resistor by a factor of four. Using ¼ of the output stage in the calibration cell also enables the calibration cell to be the same physical size as the driver, which is typically a requirement in an ASIC architecture.

The calibration cell functions as follows: An external resistor 30 placed between PADR and PADG acts as the pull-down NFETs of a driver set at a fixed impedance. The digital controllers 16 sends a 6-bit binary count to the inputs CNTP[5:0]. If the count starts at 000000, the PFET pull-up tied to PADR are off and the voltage at PADR is compared to an internal reference voltage labeled Vddq/2. The comparator senses the voltage at PADR is less then the reference, and the output ZPCNTDWN goes low. The output ZPCNTDWN=0 tells the digital controller to increment the count at the inputs CNTP[5:0]. As the count increases, the relative strength of the pull-up PFETs increases and causes the voltage at PADR to increase. When the count reaches a point where the PFET pull-up impedance is greater than the reference voltage, the output ZPCNTDWN changes to a one. The digital controller will then reduce the count until ZPCNTDWN flips back to a zero.

When the digital controller senses the ZPCNTDWN signal is toggling between one and zero each count, a fixed count PVTP[5:0] is sent to the I/Os and calibration cell. The stable count PVTP[5:0] at the calibration cell is used to control a mirror copy of the PFETS controlled by CNTP [5:0]. This mirror copy of the PFETs is schematically represented at 14a in FIG. 2. The impedance of the PFETs controlled by PVTP[5:0] are equal to the external resistor and is used to calibrate the pull down NFET impedance. With a stable count at PVTP[5:0] the digital controller starts to increment the count at CNTN[5:0]. If CNTN[5:0] starts out at 000000, the pull-down NFETs are off and the voltage at VNEVAL is pulled to Vddq through the PFETs controlled by PVTP[5:0]. The output ZNCNTDWN=0 is sent to the digital controller which forces the binary count at CNTN [5:0] to increment. CNTN[5:0] increases until the voltage at VNEVAL is greater than or equal to the internal reference Vddq/2.

At this point, the output ZNCNTDWN flips to a one. This NFET calibration works much the same way as the PFET calibration, where the controller will hold a stable count at CNTN[5:0] when it senses ZNCNTDWN is toggling each count. When a stable count is reached, the NFET impedance controlled by CNTN[5:0] matches the PFET impedance controlled by PVTP[5:0] which also matched the impedance of the external resistor. The counters will remain fixed until a change in temperature or voltage causes a change in impedance.

The EVAL is used to turn on all DC circuits in the calibration cell during an evaluation. This keep the DC power at zero when calibration is not required. The inputs SENSE and XFER are used by the comparators which are implemented as differential sense amplifiers. The signal SENSE nulls the comparator inputs to remove any offset. The signal XFER latches the comparator results each impedance evaluation cycle. The signal POR is a power on reset which puts the latched values of inputs PVTP[5:0], CNTN [5:0], CNTP[5:0] and outputs ZNCNTDWN and ZPCNT-DWN in known states. The signals RI and ZRI are used for testing.

The digital controller is an ASIC synthesizable logic macro that provides the control signals for the controlled and reference I/O cells. The logical design of the digital controller is fairly compact and simple; this lends to the controller's technology-independent nature, and thus it can be synthesized using primitive and basic logic blocks commonly found in most technology cell libraries. This allows the design to be translated to any technology offering without redesigning the control circuitry, hence dramatically reducing the design time of the programmable impedance I/O scheme.

Figure 10:
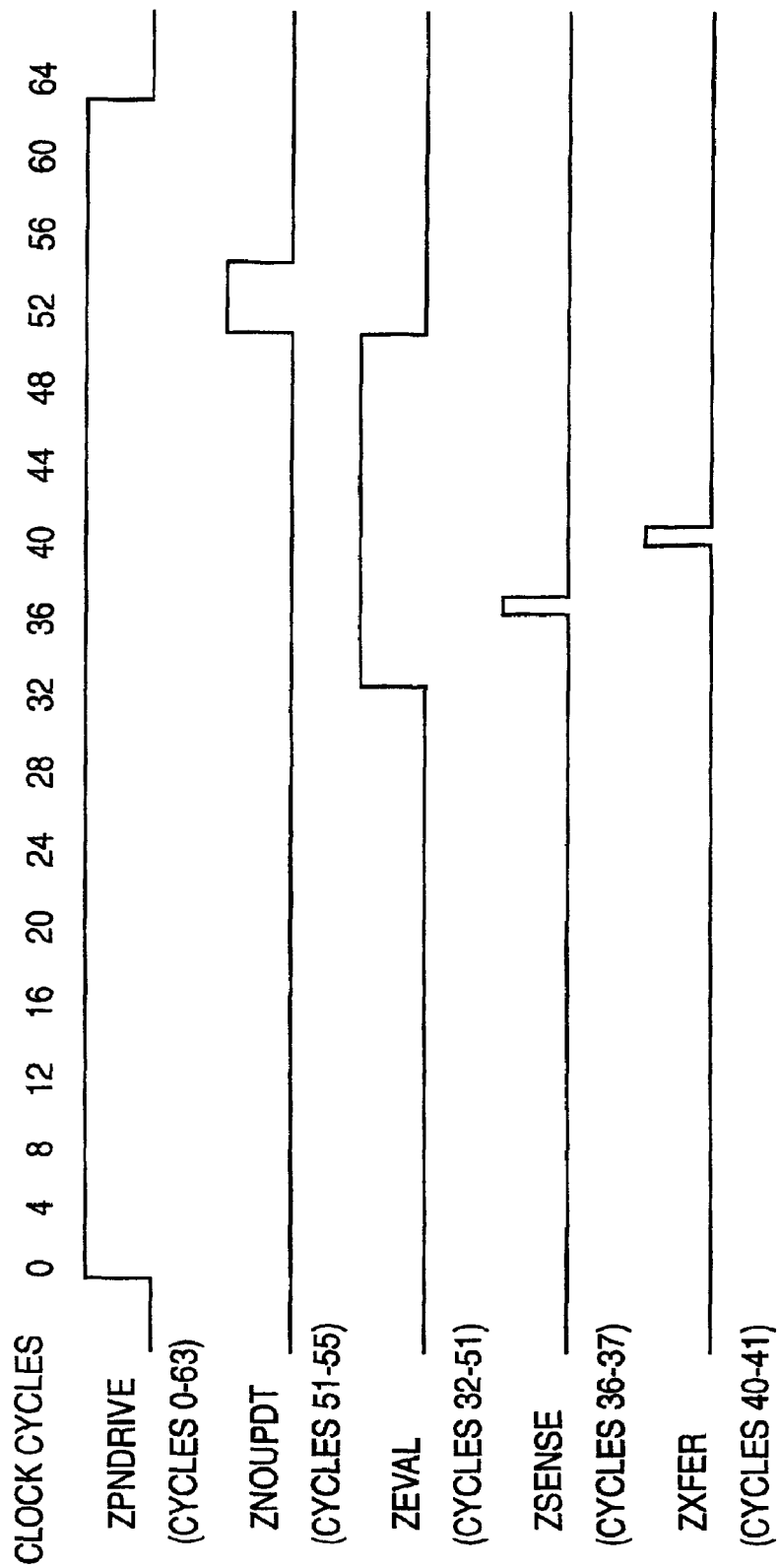
FIG. 10 shows the relative timing of the control signals generated by the digital controller.

The digital controller generates and applies the proper circuit bias signals to the calibration/reference cell, increments or decrements the impedance control value as necessary, and outputs the resultant stable impedance value to the I/O cells. The digital controller contains a 6-bit incrementer which is clocked by CLK. The incrementer resets whenever POR (power-on-reset) is active or when ENABLE is inactive. The incrementer can be viewed as a system clock cycle counter which determines the proper timing of the I/O and calibration cell control signals. A complete impedance evaluation cycle is considered to have occurred if the cycle counter has counted from b000000 to b111111 without being interrupted by POR or ENABLE. In other words, the impedance evaluation cycle is equivalent to 64 system CLK cycles. The relative timing of the control signals generated by the digital controller is shown in FIG. 10.

ZEVAL is used to turn on all DC circuits in the calibration cell during an impedance evaluation; hence it keeps the DC power at zero when calibration is not required. ZSENSE and ZXFER are used by the comparators located in the calibration cell which are implemented as differential sense amplifiers. ZSENSE nulls the comparator inputs to remove any offsets. ZXFER latches the comparator results each impedance evaluation cycle.

ZCNTN[5:0] and ZCNTP[5:0] are the latched impedance control values sent to the calibration cell for evaluation with the reference values. ZPVTN[5:0] and ZPVTP[5:0] are the latched impedance control values sent to the I/O cells. In general, the impedance values ZPVTx will only update after two consecutive and identical evaluations of ZCNTx are detected (ie, two consecutive evaluation cycles with xCNTDWN='1' or two consecutive evaluation cycles with xCNTDWN='0'). When this occurs, the impedance values will update in the evaluation cycle immediately following these two identical evaluation cycles. This behavior ensures the output of a "stable" ZPVTx impedance value when the voltage comparator is oscillating between latching a '1' and latching a '0' in xCNTDWN during consecutive evaluation cycles, indicating that the proper impedance level has been reached. The only exception to this rule is when ZCNTx maintains the same value for two consecutive evaluation cycles, in which case only one evaluation cycle with xCNTDWN=0 is required before ZCNTx is increased. This scenario arises upon POR completion, or when both ZCNTx and ZPVTx reach their minimal values.

It may be noted that the evaluation of ZCNTN is based upon the previous evaluation of ZPVTP; ZPVTP controls the "mirrored" PFET evaluation stack. This means ZPVTN in any given evaluation cycle is based upon the ZPVTP of the previous evaluation cycle.

CLKA, CLKB, and CLKC are the standard ASIC LSSD test clock signals. SI is the LSSD scan chain input, and ZSO is the LSSD scan chain output. In addition to these standard LSSD test signals, the digital controller also has a special signal ZPNDRIVE that facilitates testing of the I/O cells in the case when all of the impedance control bits are disabled. ZPNDRIVE enables the default NFET and PFET driver fingers, so that the driver will not be completely shut off in this case.

The preferred embodiment of the digital controller, as described in detail, is designed as a synthesized core or macro. The advantage of this implementation is that it never has to be redesigned in future technologies. The digital controller is carried over to future technologies in the form of VHDL code, which is pure logic and independent of technology. This is one feature that separate this ASIC architecture from a full custom design. This method provides an important advantage over prior art.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. A method of controlling the impedance of a driver of an input/output cell of an integrated circuit, comprising the steps of:

providing a reference cell including a node having a variable voltage;

providing a digital controller;

using the digital controller to generate a first variable signal and to apply the first variable signal to the reference cell to change the voltage of the node;

comparing the voltage of the node to a reference voltage;

using the digital controller to generate a second variable signal based on said comparison, including the step of adjusting said second signal until a stable value is reached for said second signal;

applying the second signal to the input/output cell to adjust the impedance of the driver of the input/output cell; and applying a third signal to the input/output cell, during a defined period of time, to prevent the input/output cell from receiving the second signal until the value of the second signal becomes stable.

2. A method according to claim 1, wherein:

the step of using the digital controller to generate a second variable signal includes the step of increasing a count value during a given period of time; and the step of applying the second signal includes the step of transmitting said count value to the input/output cell after the given period.

3. A method according to claim 2, wherein:

the reference cell includes a series of transistors for adjusting the voltage of the node; and the step of using the digital controller to generate the first signal includes the step of using the count value to activate said transistors in a given order to adjust the voltage of the node.

4. A method according to claim 1, wherein:

the reference cell includes a first set of transistors for adjusting the voltage of the node;

the input/output cell includes a second set of transistors for adjusting the input/output impedance;

each of the transistors of said first set is associated with one of the transistors in said second set;

the step of using the digital controller to generate the first signal includes the step of activating a subset of the first set of transistors to adjust the voltage of said node; and the step of applying the second signal includes the step of transmitting the second signal to the input/output cell to activate transistors of the second set of transistors that are associated with said subset of the first set of transistors.

5. A method according to claim 1, wherein:

the input/output impedance of the input/output cell varies in a defined manner as a function of a given set of variables; and the variable voltage of the node of the reference cell also varies in said defined manner as a function of said given set of variables.

6. A method according to claim 5, wherein:

the reference cell includes a reference resistor for establishing the variable voltage at said node; and said resistor has an impedance that varies in said defined manner as a function of said given set of variables.

7. A method according to claim 1, wherein the step of using the digital controller to generate the first signal includes the steps of:

if the voltage of the node is less than the reference voltage, then increasing the voltage of the node in a first manner; and if the voltage of the node is more than the reference voltage, then decreasing the voltage of the node in a second manner.

8. A method according to claim 7, wherein:

the increasing step includes the steps of i) applying a reference signal from the reference cell to the digital controller, and ii) the digital controller applying a the second signal to the reference cell to increase the voltage of the node; and the decreasing step includes the steps of
i) applying the reference signal from the reference cell to the digital controller, and
ii) the digital controller applying a the second signal to the reference cell to decrease the voltage of the node.

9. An application specific integrated circuit comprising:
an input/output cell having a varying input/output impedance;
a reference cell including a node having a variable voltage;
a digital controller to generate a first variable signal and to apply the first variable signal to the reference cell to change the voltage of the node; and
a comparator for comparing the voltage of the node to a reference voltage; and
wherein the digital controller includes
i) means to generate a second variable signal based on said comparison, including means for adjusting said second signal until a stable value is reached for said second signal,
ii) means to apply the second signal to the input/output cell to adjust the impedance of the driver of the input/output cell, and
iii) means to apply a third signal to the input/output cell, during a defined period of time, to prevent the input/output cell from receiving the second signal until the value of the second signal becomes stable.

10. An integrated circuit according to claim 9, wherein:
the first variable signal is a count value that is increased during a given period of time; and
the means to apply the second signal transmits said count value to the input/output cell after the given period.

11. An integrated circuit according to claim 10, wherein the reference cell includes:
a series of transistors for adjusting the voltage of the node; and
means for using the count value to activate said transistors in a given order to adjust the voltage of the node.

12. An integrated circuit according to claim 9, wherein:
the input/output cell includes a first set of transistors for adjusting the input/output impedance;
the reference cell further includes a second set of transistors for adjusting the voltage of the node;
each of the transistors of said second set is associated with one of the transistors in said first set;
the reference cell includes means for activating a subset of the second set of transistors to adjust the voltage of said node; and
the means apply the second signal includes means for transmitting the second signal to the input/output cell to activate transistors of the first set of transistors that are associated with said subset of the second set of transistors.

13. An integrated circuit according to claim 9, wherein:
the input/output impedance of the input/output cell varies in a defined manner as a function of a given set of variables; and
the variable voltage of said node also varies in said defined manner as a function of said given set of variables.

14. An integrated circuit according to claim 13, wherein:
the reference cell further includes a reference resistor for establishing the variable voltage at said node; and
said resistor has an impedance that varies in said defined manner as a function of said given set of variables.

15. An integrated circuit according to claim 9, wherein the reference cell includes:
means for increasing the voltage of the node in a first manner if the voltage of the node is less than the reference voltage; and
means for decreasing the voltage of the node in a second manner if the voltage of the node is more than the reference voltage.

16. An integrated circuit according to claim 9, wherein said digital controller is a synthesized core or macro.

17. A method of controlling the impedance of a driver of an input/output cell of an integrated circuit, the driver having a variable input signal, the method comprising the steps of:
providing a reference cell including a node having a variable voltage;
providing a digital controller;
using the digital controller to generate a first variable signal and to apply the first variable signal to the reference cell to change the voltage of the node;
comparing the voltage of the node to a reference voltage;
using the digital controller to generate a second variable signal based on said comparison, including the step of adjusting said second signal until a stable value is reached for said second signal;
applying the second signal to the input/output cell;
holding the second signal at the input/output cell; and
when the input signal of the driver changes in a predetermined manner, applying the second signal to the driver of the input/output cell to adjust the impedance of said driver.

18. A method according to claim 17, wherein:
the second signal includes first and second components; and
the step of applying the second signal to the driver includes the steps of
i) applying said first component to the driver to adjust the pull-up impedance thereof when the input signal of the driver decreases in a predetermined manner, and
ii) applying said second component to the driver to adjust the pull-down impedance thereof when the input signal of the driver increases in a predetermined manner.

19. An application specific integrated circuit comprising:
an input/output cell including a driver having a variable input signal and a varying input/output impedance;
a reference cell including a node having a variable voltage;
a comparator for comparing the voltage of the node to a reference voltage; and
a digital controller;
wherein the digital controller includes
i) means to generate a second variable signal based on said comparison, including means for adjusting said second signal until a stable value is reached for said second signal; and
ii) means to apply the second signal to the input/output cell to adjust the impedance of the driver of the input/output cell; and
wherein the input/output cell includes
i) a plurality of latches to hold the second signal, and
ii) means to release the second signal from said latches and to apply the second signal to the driver of the input/output cell to adjust the impedance of said driver in response to the input signal of the driver changing in a predetermined manner.

20. An application specific integrated circuit according to claim 19, wherein:

the second signal includes first and second components; and the means to release the second signal from said latches and to apply the second signal to the driver includes means for i) applying said first component to the driver to adjust the pull-up impedance thereof when the input signal of the driver decreases in a predetermined manner, and ii) applying said second component to the driver to adjust the pull-down impedance thereof when the input signal of the driver increases in a predetermined manner.

* * * * *